United States Patent [19]
Casper

[11] Patent Number: 6,141,264
[45] Date of Patent: *Oct. 31, 2000

[54] FLOATING ISOLATION GATE FOR DRAM SENSING

[75] Inventor: Stephen L. Casper, Boise, Id.

[73] Assignee: Micron Technology, Inc., Boise, Id.

[*] Notice: This patent is subject to a terminal disclaimer.

[21] Appl. No.: 09/123,701

[22] Filed: Jul. 28, 1998

Related U.S. Application Data

[63] Continuation of application No. 08/871,523, Jun. 9, 1997, Pat. No. 5,835,433.

[51] Int. Cl.[7] .................................................... G11C 7/00
[52] U.S. Cl. ........................ 365/190; 365/149; 365/207
[58] Field of Search .................................. 365/190, 149, 365/207

[56] References Cited

U.S. PATENT DOCUMENTS

| | | | |
|---|---|---|---|
| 4,991,142 | 2/1991 | Wang | 365/149 |
| 5,381,364 | 1/1995 | Chern et al. | 365/149 |
| 5,506,811 | 4/1996 | McLaury | 365/149 |
| 5,566,116 | 10/1996 | Kang | 365/149 |
| 5,835,433 | 11/1998 | Casper | 365/207 |

*Primary Examiner*—Tan T. Nguyen
*Attorney, Agent, or Firm*—Schwegman, Lundberg, Woessner & Kluth, P.A.

[57] ABSTRACT

A method of operating a sense amplifier comprises floating an isolation gate line signal when a memory cell is being accessed. In one embodiment, the isolation gate is first turned on by biasing the gate line of the isolation gate. Then, the input of a sense amplifier is coupled to a desired memory cell and about the same time, the isolation gate is floated. The isolation gate is at least partially turned off by a reduction in the voltage level of the ISO gateline through capacitance based decay. This at least partially isolates other memory cells and/or circuitry accessed through a set of digit lines, allowing the sense amplifier to more easily sense the state of the desired memory cell. The isolation gate is floated by coupling the gate line of the isolation gate to a high impedance. The sense amplifier may be an N-sense amplifier. The isolation gate is floated prior to sense amplifier being activated. The voltage level of the ISO signal is reduced by parasitic coupling to other circuitry associated with the sense amplifier. Since the ISO gate is floated prior to the sense amplifier being activated, there is less sensitivity to timing inaccuracies. In addition, a resulting larger differential voltage on the digit lines is more easily and quickly sensed by the sense amplifier.

15 Claims, 2 Drawing Sheets

FLOATING ISOLATION GATE FOR DRAM SENSING

This patent application is a continuation of U.S. patent application Ser. No. 08/871,523, filed Jun. 9, 1997, now issued as U.S. Pat. No. 5,835,433. U.S. Pat. No. 5,835,433 is incorporated herein by reference.

FIELD OF THE INVENTION

The present invention relates generally to semiconductor memory devices, and more specifically to sense amplifiers in semiconductor memory devices.

BACKGROUND OF THE INVENTION

Semiconductor memory devices such as dynamic random access memory (DRAM) devices are widely used in computers and other electronic devices. As the speed of such electronic devices increases, it is important that the speed of accessing data stored in the memory devices also increases or at least does not decrease as the density of the memory devices increases so that the electronic devices do not have to wait for data.

Most modem DRAMs use a well known set of circuits in an array of memory cells to sense a small charge from a chosen memory cell. The charge is amplified to a much larger, full-rail voltage on a pair of digit lines. Such circuity, called sense amplifiers, essentially function as enabled flip-flops. The data access speed in a DRAM can be enhanced by improving the speed of the sense amplifiers.

A well known enhancement of the sense amplifier circuitry is the addition of isolation gates between the digit lines and a N-channel sense amplifier. Such isolation gates resistively separate the N-sense amplifier from the digit line capacitances. As a result, the N-sense amplifier latches data much more quickly. The benefit of isolation gates is more significant for higher density DRAMs, which have longer digit lines, and thus higher digit line capacitances.

The isolation gates are controlled by a control signal which must be accurately timed in relation to other DRAM signals, such as the signal that activates the N-sense amplifier. If the timing of the control signal is inaccurate, the N-sense amplifier may not operate as desired. Therefore, there is a need for a method to control the isolation gates in a manner that is less sensitive to timing inaccuracies.

SUMMARY OF THE INVENTION

A method of operating a sense amplifier comprises floating an isolation gate line signal when a memory cell is being accessed. In one embodiment, the isolation gate is first turned on by biasing the gate line of the isolation gate. Then, the input of a sense amplifier is coupled to a desired memory cell and about the same time, the isolation gate is floated. The isolation gate is at least partially turned off by a reduction in the voltage level of the ISO gateline through capacitance based decay. This at least partially isolates other memory cells and/or circuitry accessed through a set of digit lines, allowing the sense amplifier to more easily sense the state of the desired memory cell.

In one embodiment, the isolation gate is floated by coupling the gate line of the isolation gate to a high impedance. The sense amplifier may be an N-sense amplifier. The isolation gate is floated prior to the sense amplifier being activated.

The voltage level of the ISO signal is reduced by parasitic coupling to other circuitry associated with the sense amplifier. Since the ISO gate is floated prior to the sense amplifier being activated, there is less sensitivity to timing inaccuracies. In addition, a resulting larger differential voltage on the digit lines is more easily and quickly sensed by the sense amplifier. Further features and advantages of the present invention, as well as the structure and operation of various embodiments of the present invention, are described in detail below with reference to the accompanying drawings.

BRIEF DESCRIPTION OF THE DRAWINGS

The present invention is described with reference to the accompanying drawings. In the drawings, like reference numbers indicate identical or functionally similar elements. Additionally, the leftmost digit(s) of a reference number identifies the drawing in which the reference number first appears.

DETAILED DESCRIPTION OF THE EMBODIMENTS

In the following detailed description of the preferred embodiments, reference is made to the accompanying drawings which form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense, and the scope of the present invention is defined only by the appended claims.

Figure 1:
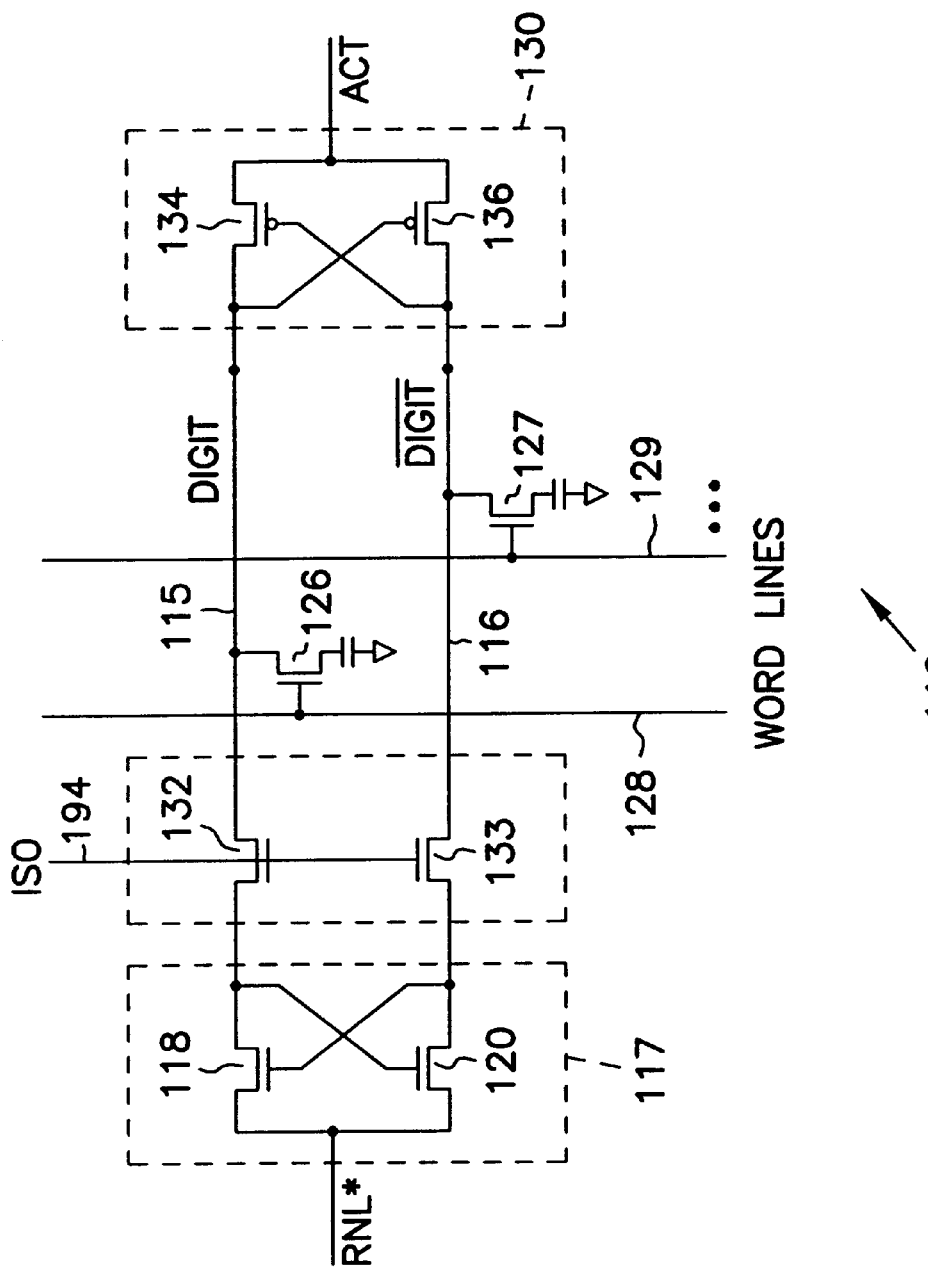
FIG. 1 is schematic diagram of sense amplifier circuitry.

A sense amplifier is indicated generally at 110 in FIG. 1. A pair of DIGIT lines 115 and 116 is coupled to memory cells 126 and 127 of a dynamic random access memory (DRAM). The memory cells 126 and 127 are selected in a well known manner via wordlines 128 and 129. Multiple memory cells and wordlines are coupled to the DIGIT lines. Only the memory cell selected by a single wordline will affect the voltage on one of the DIGIT lines.

In order to both read and refresh data in a memory cell, the charge of the cell must be amplified by a sense amplifier. An N-sense amplifier is provided generally at 117, and comprises a pair of cross coupled n-channel enhancement mode field effect transistors 118 and 120. The sources of both cross coupled transistors 118 and 120 are coupled to the RNL* signal. The N-sense amplifier 117 is electrically isolated from a P-sense amplifier 130 by a pair of isolation gates 132 and 133. The isolation gates 132 and 133 may also be n-channel transistors. The isolation gates 132 and 133 are biased by applying the ISO signal to a gate line 194.

The P-sense amplifier 130 comprises a pair of cross coupled p-channel enhancement mode field effect transistors 134 and 136. The sources of both the cross coupled transistors 134 and 136 are coupled to the ACT signal.

Figure 2:
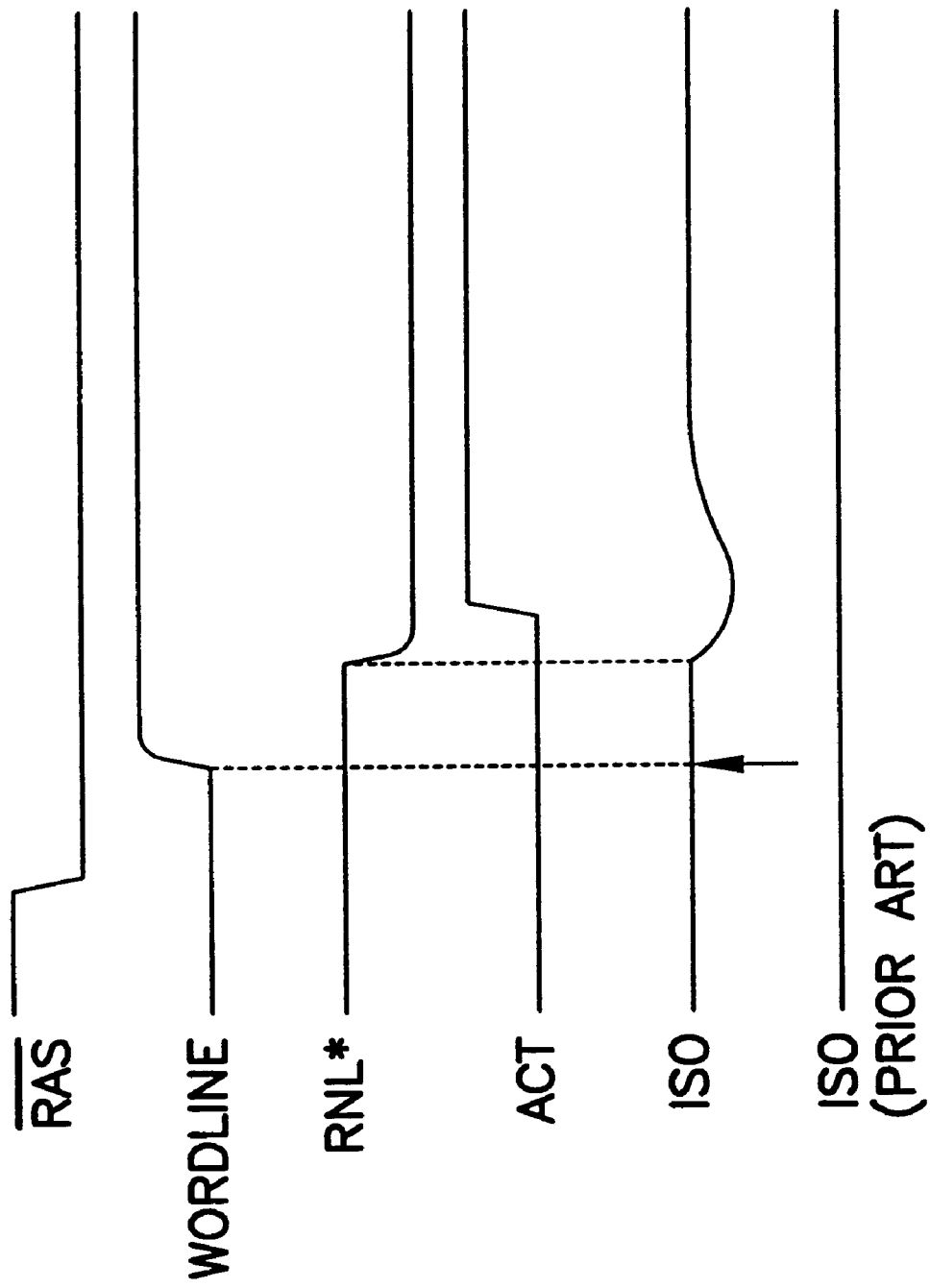
FIG. 2 is a timing diagram of signals associated with the sense amplifier circuitry.

A timing diagram is shown in FIG. 2, with signal names corresponding to those shown in FIG. 1. Initially, the DIGIT lines 115 and 116, which have a finite capacitance, are precharged to a voltage, such as Vcc/2. Then, a complement of a row access strobe (RAS) signal is transitioned low to permit, for example, reading and refreshing data of the DRAM. Next, a WORDLINE signal is transitioned high on a select wordline 128. Thus, charge from one memory cell 126 is coupled to a corresponding DIGIT line 115. Depending on the charge in the memory cell 126, the voltage of the DIGIT line 115 will decrease or increase. As a result, a voltage difference will form across the pair of DIGIT lines 115 and 116.

The data, to be transmitted to external circuitry, such as a microprocessor, is obtained by amplifying this voltage difference. The N-sense amplifier 117 is activated by transitioning the RNL* signal to a low level, such as zero volts. As a result, the voltages on the gates and drains of the cross coupled n-channel enhancement mode field effect transistors 118 and 120 will be reduced initially. However, finally, only the voltage associated with the DIGIT line having the relatively lower voltage will be shifted by the N-sense amplifier 117 to a lower voltage, such as zero volts.

After the RNL* signal is transitioned to a low level, the ACT signal is transitioned to a high level, such as Vcc. As a result, the voltage of the DIGIT line having the relatively higher voltage will be amplified, or shifted, by the P-sense amplifier 130 to a higher voltage, such as Vcc.

Conventionally, the N-sense amplifier 117 is not isolated from the DIGIT lines 115 and 116 during its operation. This is accomplished, for example, by holding the ISO signal at a high level, such as Vcc, as shown in the prior art ISO timing diagram of FIG. 2. As a result, the switching speed of the N-sense amplifier 117 is reduced because it has to pull down the voltage of a DIGIT line having a relatively high capacitance.

To improve switching speed, the ISO signal is also conventionally ransitioned to a low level to turn off the isolation gates 132 and 133. Hence, the N-sense amplifier 117 is isolated from the DIGIT lines 115 and 116. However the transition of the ISO signal must be accurately timed to occur between the WORDLINE and RNL* signal transitions, described earlier. If the ISO signal is not accurately timed relative to these signals, the DRAM may not operate properly.

Therefore, there is a need to control the isolation gates 132 and 133 in a manner that does not require accurate timing of the ISO signal. This can be accomplished by deriving the ISO signal from the N-sense amplifier 117. First, the isolation gates 132 and 133 are turned on by applying an ISO signal of a high voltage level to the gate line 194. Preferably, the high voltage level of the ISO signal is minimized to the level of the high voltage on the DIGIT lines 115 and 116 plus the threshold voltage of the isolation gates 132 and 133. Then, the input of the N-sense amplifier 117, formed by the gates and drains of the cross coupled transistors 118 and 120, is charged by the voltage present on the DIGIT lines 115 and 116. Next, the gate line 194 is terminated by a high impedance to float the ISO signal. The ISO signal is floated at or after the time when the WORDLINE signal is transitioned high, but prior to the time when the N-sense amplifier 117 is activated. The transition of the WORDLINE signal to a high level is denoted by the arrow in FIG. 2. The signals illustrated in FIG. 2 correspond to those denoted in FIG. 1. However, FIG. 2 is not represented as an accurate portrayal of actual performance.

After the ISO signal is floated, the RNL* signal is transitioned low to activate the N-sense amplifier 117. The gates and drains of the cross coupled transistors 118 and 120 are coupled to the gate line 194 by parasitic capacitances of the DRAM. As a result, when the voltages on the gates and drains of the cross coupled transistors 118 and 120 are reduced, the voltage of the ISO signal will also be reduced, as shown in FIG. 2. Thus, the ISO signal is derived from the N-sense amplifier 117. The reduction of the voltage of the ISO signal on the gate line 194 will turn off, at least partially, the isolation gates 132 and 133. Thus, the channel impedance of the isolation gates 132 and 133 will be increased. Hence, the N-sense amplifier 117 will be initially isolated from the DIGIT lines 115 and 116 by the increased channel impedance of the isolation gates 132 and 133. Thus, the DIGIT lines 115 and 116 will no longer detrimentally load down and diminish the switching speed of the N-sense amplifier 117. Furthermore, when the isolation gates 132 and 133 are turned off, at least partially, the stability, or Beta, of the N-sense amplifier 117 is increased.

The gate line 194 is also coupled to the DIGIT lines 115 and 116 by parasitic capacitances of the DRAM. Therefore, when the P-sense amplifier 130 shifts the voltage on one DIGIT line to a higher voltage, for example Vcc, the voltage of the ISO signal will be pulled to a higher voltage level, as shown in FIG. 2. As a result, the isolation gates 132 and 133 may be turned on again.

It should be noted that for many field effect transistors, the sources and drains are essentially interchangeable, and interconnections specified herein should not be interpreted as solely limited to those described. In addition, while some transistors were described as an n-channel transistor, it is recognized by those skilled in the art that a p-channel transistor may also be used.

I claim:

1. A method of accessing data in a dynamic random access memory device comprising:

turning on an isolation circuit via an isolation input to conductively couple digit lines to a sense amplifier;

conductively coupling a memory cell to at least one of the digit lines; and floating the isolation input prior to sense amplifier activation.

2. The method of claim 1, wherein the floating of the isolation input at least partially turns off the isolation circuit.

3. A DRAM memory comprising:

a plurality of memory cells coupled by digit lines;

a plurality of isolation gates coupled between the memory cells and the digit lines;

a plurality of wordlines coupled to the memory cells, wherein after a wordline has been triggered, at least one associated isolation gate is floated.

4. A dynamic random access memory, comprising:

first means, for storing charge, coupled by digit lines;

second means for amplifying the stored charge;

third means for isolating the second means from the digit lines; and a plurality of wordlines coupled to the memory cells, wherein after a wordline has been triggered, at least one of the third means is floated.

5. A method of operating a sense amplifier in a semiconductor memory device, comprising:

turning on an isolation circuit by applying a bias to the isolation circuit;

coupling a sense amplifier to a memory cell through the isolation circuit;

charging an input of the sense amplifier coupled to the isolation gate;

floating the bias applied to the isolation circuit;

activating the sense amplifier after performing the terminating;

partially turning off the isolation circuit by varying the bias applied to the isolation circuit; and amplifying a voltage difference at the input of the sense amplifier.

6. The method of claim 5, wherein the sense amplifier is a N-sense amplifier.

7. The method of claim 5, wherein the isolation circuit is partially turned off during the amplification.

8. The method of claim 5, further comprising turning on the isolation circuit by varying the bias applied to the isolation circuit during the amplification and after the isolation circuit has been partially turned off.

9. The method of claim 5, wherein floating the bias comprises floating the bias when a voltage on a wordline transitions to a relatively high level.

10. The method of claim 5, wherein the sense amplifier is activated by transitioning a voltage on a control line of the sense amplifier to a relatively low level.

11. A method of operating an N-sense amplifier, having first and second cross coupled transistors, in a semiconductor memory comprising:

turning on an isolation circuit by applying a bias voltage to an isolation circuit control line;

charging gates and drains, of the first and second cross coupled transistors, coupled to the isolation circuit;

terminating the isolation circuit control line with a high impedance to float the bias voltage on the isolation circuit control line;

activating the sense amplifier after performing the terminating;

coupling a voltage from the first and second cross coupled transistors to the isolation circuit control line;

partially turning off the isolation circuit;

amplifying a voltage difference at the input of the first and second cross coupled transistors; and turning on the isolation circuit after the isolation circuit has been partially turned off by varying the bias voltage on the isolation circuit control line during the amplification and after the isolation circuit has been partially turned off.

12. The method of claim 11, wherein the first and second cross-coupled transistors are n-channel enhancement mode transistors.

13. The method of claim 11, wherein the isolation circuit comprises an n-channel transistor.

14. The method of claim 11, further comprising the of turning on the isolation circuit by coupling a voltage from a digit line to the isolation circuit control line during the amplification and after the isolation circuit has been partially turned off.

15. The method of claim 11, wherein the isolation circuit is partially turned off during the amplification.

* * * * *